(12) United States Patent
Kimura

(10) Patent No.: US 7,126,425 B2
(45) Date of Patent: Oct. 24, 2006

(54) VOLTAGE CONTROL CIRCUIT FOR COMMON MODE VOLTAGE AND METHOD FOR CONTROLLING THE SAME

(75) Inventor: Katsuji Kimura, Kanagawa (JP)

(73) Assignee: NEC Electronics Corporation(JP)

( * ) Notice: Subject to any disclaimer, the term of this patent is extended or adjusted under 35 U.S.C. 154(b) by 0 days.

(21) Appl. No.: 10/808,643

(22) Filed: Mar. 25, 2004

(65) Prior Publication Data

US 2004/0189392 A1    Sep. 30, 2004

(30) Foreign Application Priority Data

Mar. 28, 2003  (JP)  ............... 2003-089507

(51) Int. Cl.
*H03F 3/45* (2006.01)
(52) U.S. Cl. .................... 330/258; 330/260
(58) Field of Classification Search ........... 330/258, 330/260
See application file for complete search history.

(56) References Cited

U.S. PATENT DOCUMENTS

| 5,194,831 | A | * | 3/1993 | Jackson ................ 331/111 |
| 5,281,924 | A |   | 1/1994 | Maloberti et al. ........ 330/253 |
| 5,381,113 | A |   | 1/1995 | Kimura ................. 330/253 |
| 5,408,497 | A |   | 4/1995 | Baumann et al. ............ 375/7 |
| 5,491,447 | A |   | 2/1996 | Goetschel et al. ........ 330/254 |
| 5,936,466 | A | * | 8/1999 | Andoh et al. ............ 330/253 |
| 5,990,737 | A | * | 11/1999 | Czarnul et al. ........... 330/69 |
| 6,298,226 | B1 |  | 10/2001 | Lloyd et al. ............ 455/296 |
| 6,774,722 | B1 | * | 8/2004 | Hogervorst ............. 330/258 |
| 6,784,698 | B1 | * | 8/2004 | Brenden ................ 327/51 |
| 2002/0118061 | A1 | | 8/2002 | Altmann ............... 327/552 |

FOREIGN PATENT DOCUMENTS

EP    1 378 814    7/2004

OTHER PUBLICATIONS

Silva-Martinez, et al., "Design Technique for High-Performance Full-CMOS OTA RC Continuous-Time Filters" IEEE Journal of Solid State Circuits, vol. 27, No. 7, pp. 993-1001, Jul. 2002.

* cited by examiner

*Primary Examiner*—Patricia Nguyen
(74) *Attorney, Agent, or Firm*—Hayes Soloway P.C.

(57) ABSTRACT

A common mode voltage detection circuit 105 detects a common mode voltage VCM from differential output terminals of a differential output circuit 101. The common mode voltage detection circuit outputs a detected voltage VCM2 in accordance with the common mode voltage VCM. An OTA 106 in the common mode feedback loop inputs or outputs multiple currents of the same phase in accordance with a voltage difference between a reference voltage VCM1 and the detected voltage VCM2. The respective multiple currents of the same phase are inputted/outputted to/from the two respective terminals of the differential output terminals. The common mode voltage can be reduced by flowing the currents into the differential output terminals, and can be increased by leading the currents from the differential output terminals. Thus, a phase margin or a gain margin of a control signal loop can be secured even with low current consumption, thereby realizing stable operation of the circuit.

6 Claims, 4 Drawing Sheets

VOLTAGE CONTROL CIRCUIT FOR COMMON MODE VOLTAGE AND METHOD FOR CONTROLLING THE SAME

BACKGROUND OF THE INVENTION

1. Field of the Invention

The present invention relates to a voltage control circuit for a common mode voltage and a method for controlling the same. More specifically, the present invention relates to a voltage control circuit of a common mode voltage for an operational amplifier or an operational transconductance amplifier (hereinafter abbreviated as OTA) which has differential outputs and controls the common mode voltage of the differential outputs, and to a method for controlling the common mode voltage.

2. Description of the Related Art

As an integration of semiconductor integrated circuits becomes higher and digital technologies develop more advancement in recent years, circuits with digital and analog circuits formed in a large scaled integrated (LSI) chip have been mounted in many consumer products.

Moreover, in the field of analog circuits, circuits such as operational amplifiers or OTAs having differential outputs are well known. For the circuit shaving the differential outputs, many circuits with various configurations have heretofore been disclosed as a circuit for controlling a common mode voltage of the differential output.

FIG. 1 is a circuit block diagram showing an example of a configuration of a conventional common mode voltage setting circuit described in Document 1. This conventional common mode voltage setting circuit detects a common mode voltage of differential output terminals using a detection circuit 203.

The detected common mode voltage VCM from the detection circuit 203 is inputted to one of input terminals of an operational amplifier 204 and a constant reference voltage VCM1 is also inputted to the other input terminal of the operational amplifier 204. The output terminal of the operational amplifier 204 is connected to the control terminals flowing through an OTA1 (201) and an OTA2 (202) both with a differential output. The common mode voltage is controlled by the operational amplifier 204 and is set at a desired voltage by setting driving currents of OTA1 (201) and OTA2 (202) through the current mirror circuits.

A control signal loop for setting the common mode voltage is included in the foregoing circuit configuration, in addition to an ordinary signal loop for processing an input signal to output it as a desired signal. The OTAs whose transconductances are proportional to their driving currents or a square-root of their driving currents substantially function as multipliers which receive two kinds of signals, the input signal and a control signal. Therefore, with regard to the control signal loop, influence of the ordinary signal loop appears therein, which makes it difficult to keep a phase margin or a gain margin for the control signal loop.

Moreover, in order to reduce a set voltage error of the common mode voltage setting circuit, a gain of the control signal loop should be set higher. However, when the gain is set higher, circuit operation becomes unstable because the phase margin for the control signal loop becomes smaller, thereby causing a problem that an oscillation phenomenon appears in the control signal loop. On the other hand, when the gain of the control signal loop is set lower so that the circuit operates stably, the setting error of the common mode voltage on an output side cannot be made to be a desired value or less.

[Document 1]
J. Silva-Martinez, M. S. J. Steyaert, and W. Sansen, Design Techniques for High-Performance Full-CMOS OTA-RC Continuous-Time Filters, IEEE Journal of Solid-State Circuits, Vol. 27, No. 7, pp. 993–1001, July 1992.

The present inventor has recognized that, in the conventional circuit configuration, the operational amplifier or the OTA, which are to be controlled, functions as a multiplier that receives two kinds of signals, the input signal and the control signal, in order to secure the phase margin or the gain margin as large as possible. Therefore, an influence of the input signal appears in the control signal loop, it makes the control signal loop very difficult to secure the phase margin or the gain margin.

Moreover, when the gain of the control signal loop is reduced in order to secure the phase margin of the control signal loop, the setting error becomes large. To alleviate this problem in the conventional circuit configuration as much as possible, the driving current of the operational amplifier should be increased to raise the operating frequency characteristic of the control signal loop thereof. Therefore, it is difficult to reduce current consumption of the circuit.

The present invention is made in consideration of the above conventional technology. An object of the invention is to provide a voltage control circuit for a common mode voltage capable of effectively controlling the common mode voltage of the differential output.

SUMMARY OF THE INVENTION

A voltage control circuit for a common mode voltage according to a first aspect of the present invention includes: a detection circuit for detecting a common mode voltage from differential output terminals of a differential circuit, and outputting a detected voltage based on the common mode voltage of the differential output; and a transconductance circuit for inputting the detected voltage and a first reference voltage, and inputting/outputting currents based on a voltage difference between the detected voltage and the first reference voltage. The outputted currents from the operational transconductance amplifier are inputted to the differential output of the differential output circuit. The voltage control circuit for the common mode voltage according to the first aspect of the present invention can effectively control the common mode voltage of the differential output with the above configuration.

A method for controlling a common mode voltage of differential output according to a second aspect of the present invention includes the steps of: detecting a common mode voltage of the differential output terminals; outputting a detected voltage based on the common mode output voltage; and outputting currents in accordance with a voltage difference between the detected voltage and a first reference voltage. With this configuration, the common mode voltage of the differential output can be effectively controlled.

DETAILED DESCRIPTION OF THE
PREFERRED EMBODIMENT

The invention will be now described herein with reference to illustrative embodiment. Those skilled in the art will recognize that many alternative embodiments can be accomplished using the teachings of the present invention and that the invention is not limited to the embodiment illustrated for an explanatory purpose.

Figure 1:
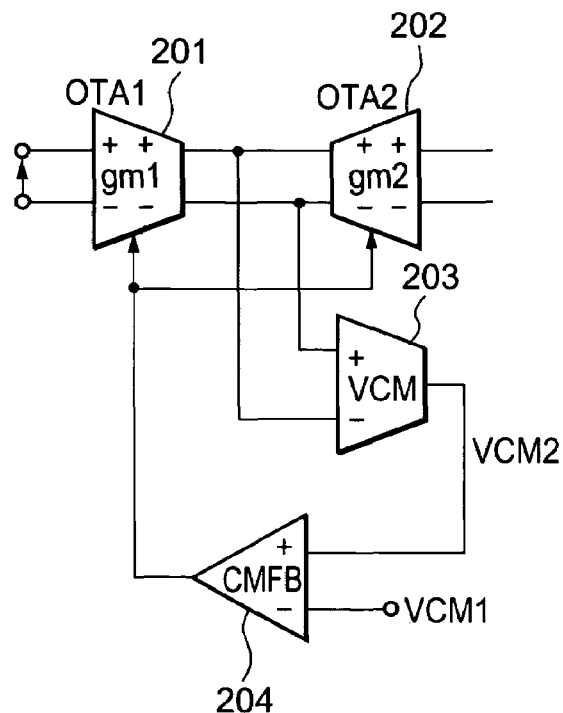
FIG. 1 depicts a circuit configuration of a control circuit for a common mode voltage according toga conventional art.

First, an example of a semiconductor integrated circuit device of the present invention will be described in detail with reference to a drawing. In the drawing, reference codes are the same as FIG. 1 that denotes the same elements, and an explanation thereof will be omitted as appropriate in the detailed description below.

Second, an applicable embodiment of the present invention will be described. The description will be given of an illustrative purpose only of the embodiment of the present invention, and thus the present invention is not limited to the embodiment below. Some description may be omitted and simplified as appropriate to clarify the explanation. Moreover, to someone skilled in the art, respective elements of the embodiment can be easily modified, added or changed within the scope of the present invention.

Figure 2:
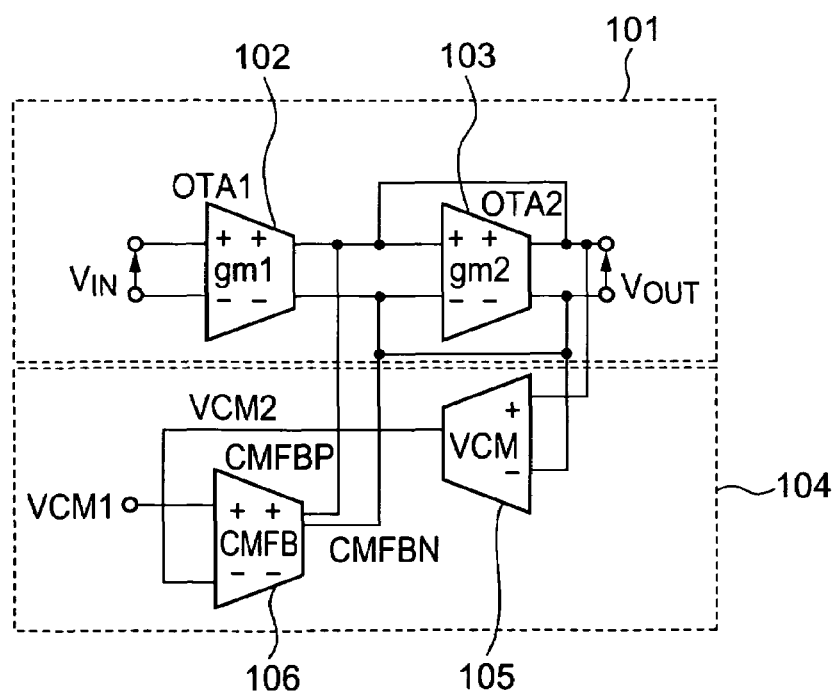
FIG. 2 depicts a circuit configuration of a control circuit for a common mode voltage according to an example of the present invention.

FIG. 2 is a circuit block diagram showing a schematic configuration of a voltage control circuit for a common mode voltage according to the present example. In the voltage control circuit for a common mode voltage of the embodiment, an operational transconductance amplifier whose output current is in accordance with a differential input voltage is used in a control signal loop, thereby simplifying the control signal loop. Thus, a phase margin of the control signal loop can be secured, and the control circuit can operate stably.

Referring to FIG. 2, the voltage control circuit for a common mode voltage of this example includes a differential output circuit 101 which produces a differential output in accordance with differential input, and a common mode voltage control circuit 104 which controls a common mode voltage of the differential output circuit 101. The differential output circuit 101 of the present example outputs a differential output voltage in accordance with differential input voltage. The voltage control circuit for the common mode voltage of the present invention can be applied to a differential output circuit. Further, the voltage control circuit for the common mode voltage of the present invention can be applied to various differential output circuits made up of circuits such as operational amplifiers and OTAs having a differential output.

The differential output circuit 101 includes a first OTA 102 with a transconductance of gm1, and a second OTA 103 with a transconductance of gm2. The first and second OTAs 102 and 103 input a differential voltage, and output or input currents as a differential output in accordance with the respective transconductances and the differential voltage. For each of the first and second OTAs 102 and 103, a circuit whose transconductance is electronically variable or invariable can be used. An input differential voltage (Vin) is inputted from outside the differential output circuit 101 to two differential input terminals of the first OTA 102.

The first OTA 102 is connected to the second OTA 103, and two respective differential output terminals of the first OTA 102 are connected to two respective differential input terminals of the second OTA 103, in which terminals of the same positive/negative phase are connected to each other between the first and second OTAs 102 and 103. A differential output voltage (Vout) is outputted from differential output terminals of the second OTA 103 to the outside of the differential output circuit 101. The respective output terminals of the second OTA 103 are simultaneously connected to the respective input terminals of the second OTA 103, that is, the output terminal and the input terminal of the same phase are connected to each other. The second OTA 103 translates the differential output current from the first OTA 102 to the differential output voltage thereof.

When the input differential voltage (Vin) is inputted from outside, the first OTA 102 outputs a differential current in accordance with the differential input voltage. The differential current is then inputted to the second OTA 103. The second OTA 103 is driven by the differential output current from the first OTA 102, and outputs the voltages Vout in accordance with the differential input current.

Figure 3C:
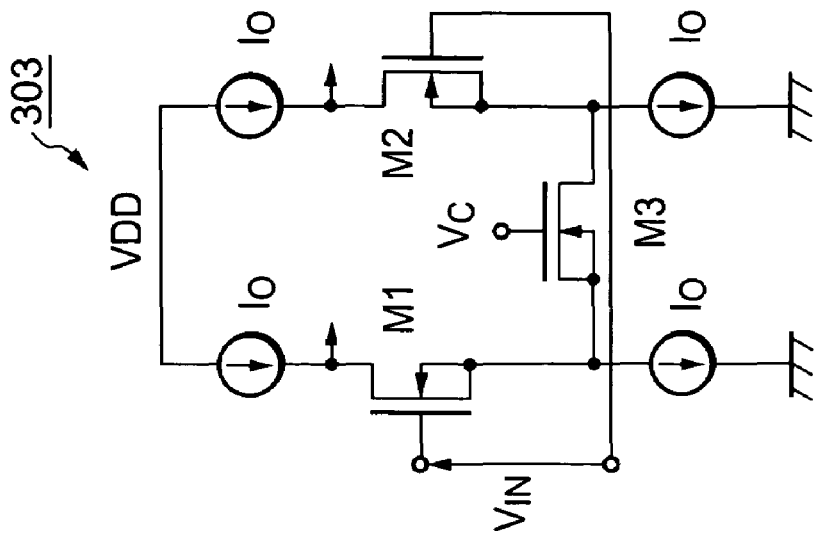
FIG. 3C depicts a circuit configuration of the third example of the OTA for a common mode voltage according to the present invention.
Figure 3B:
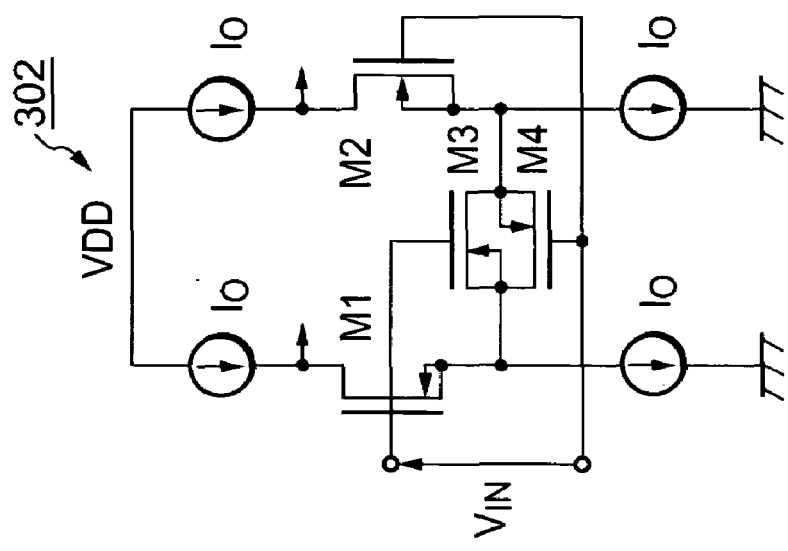
FIG. 3B depicts a circuit configuration of the second example of the OTA for a common mode voltage according to the present invention.
Figure 3A:
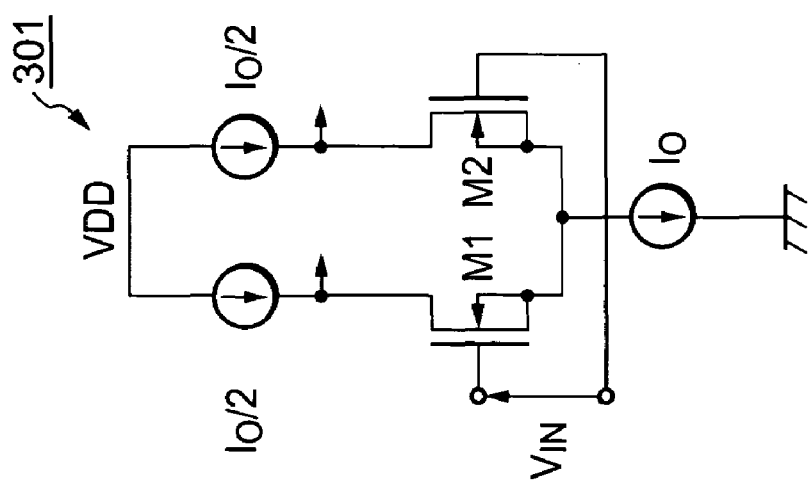
FIG. 3A depicts a circuit configuration of the first example of the OTA for a common mode voltage according to the present invention.

These OTA have the various kind of the circuit configuration as shown in the FIG. 3A, the FIG. 3B and the FIG. 3C.

Next, the voltage control circuit for a common mode voltage according to the present embodiment will be described. The common mode voltage control circuit 104 controls the common mode voltage of the differential output circuit 101. Moreover, the common mode voltage control circuit 104 controls the common mode voltage by feeding back currents to a differential output of the differential output circuit 101 in accordance with the common mode voltage of the differential output circuit 101. The common mode voltage control circuit 104 includes a common mode voltage detection circuit 105 and an OTA 106 in a common mode feedback.

The common mode voltage detection circuit 105 detects the common mode voltage outputted from the differential output circuit 101, and outputs a detected voltage VCM2. The detected voltage is determined based on the common mode voltage, and can be a same voltage as the common mode voltage or one having a predetermined relationship with the common mode voltage. A widely known circuit configuration such as a passive detection circuit utilizing two resistances or an active detection circuit utilizing an OTA (referencing FIG. 4) can be used for the common mode voltage detection circuit 105.

Figure 4:
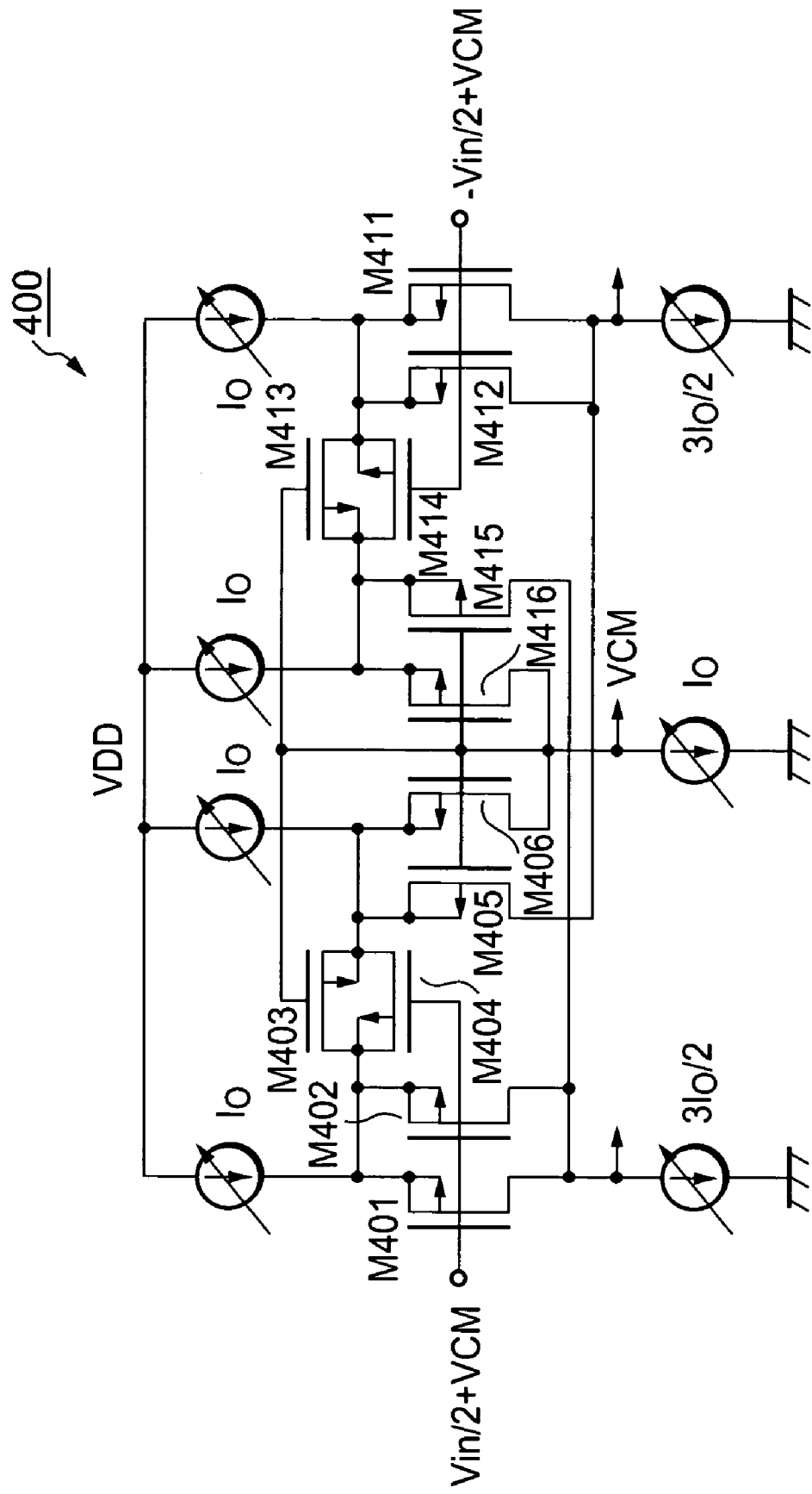
FIG. 4 depicts a circuit configuration of an example of a common mode voltage detection circuit for a common mode voltage according to the present invention.

The circuit shown in FIG. 4 is an OTA with the common mode voltage detection circuit. Referencing FIG. 4, the common mode voltage detection circuit comprising the same two MOS operational transconductance amplifiers as the same circuit topology of an operational transconductance amplifier shown in FIG. 3B in series-connected. One of a differential input voltage (Vin/2+VCM) is added to the first operational transconductance amplifier consisting of MOS transistors M401, M402, M403, M404, N405, and M406, in the other hand, the other of a differential input voltage (−Vin/2+VCM) is added to the second operational transconductance amplifier consisting of MOS transistors M411, M412, M413, M414, N415, and M416. Two added terminal voltages of (Vin/2+VCM) and (−Vin/2+VCM) are divided by two by the two operational transconductance amplifier, and the common mode voltage of VCM, which is an average voltage of the two added terminal voltage of (Vin/2+VCM) and (−Vin/2+VCM), is obtained as the common gate voltage of MOS transistors M405, M406, M415, and M416.

The OTA 106 in the common mode feedback loop inputs a differential voltage and outputs or inputs a current in accordance with the differential voltage. Various designs of circuits are applicable to the OTA 106 in the common mode feedback loop, for example, a circuit that electronically adjusts the transconductance or one which does not as in the cases of the first and second OTAs 102 and 103. The OTA 106 in the common mode feedback loop, for example, is shown in the FIG. 5. In the common mode voltage control circuit 104, the OTA 106 in the common mode feedback loop outputs currents of a same phase in accordance with the differential input voltage.

The respective differential output terminals of the second OTA 103 are connected to the respective input terminals of the common mode voltage detection circuit 105. An output of the common mode voltage detection circuit 105 is connected to one of the differential input terminals of the OTA 106 in the common mode feedback loop. A reference voltage VCM1 can be inputted to the other differential input terminal of the OTA 106 in the common mode feedback loop. Here, a constant reference voltage determined in advance can be inputted as the input voltage VCM1. For the reference voltage, an appropriate voltage can be determined in accordance with the circuit design.

Figure 5:
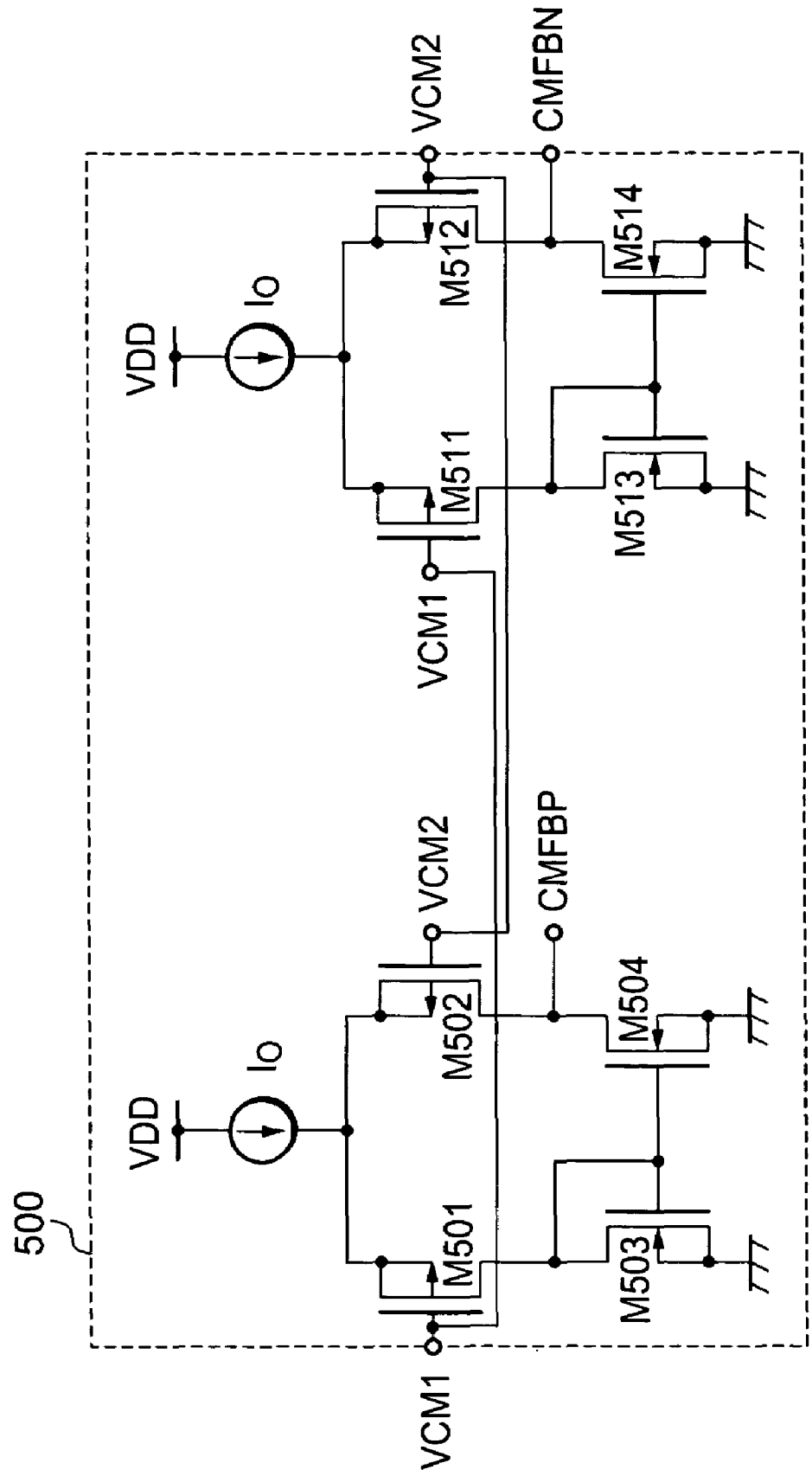
FIG. 5 depicts a circuit configuration of an example of the OTA in the common mode feedback loop for a common mode voltage according to the present invention.

Referencing FIG. 5, a CMFB 500 in the common mode feedback loop comprises a MOS transistor M501 which receives an input signal (VCM1) and a MOS transistor M502 which receives an input signal (VCM2). Furthermore, the CMFB 500 in the common mode feedback loop comprises MOS transistors (M503, M504) which configure a current mirror circuit with MOS transistors (M501, M502). The CMFB 500 outputs an output signal (CMFBP).

Similarly, the CMFB 500 in the common mode feedback loop comprises a MOS transistor M511 which receives an input signal (VCM1) and a MOS transistor M512 which receives an input signal (VCM2). Furthermore, the CMFB 500 in the common mode feedback loop comprises MOS transistors (M513, M514) which configure a current mirror circuit with MOS transistors (M511, M512). The CMFB 500 outputs an output signal (CMFBN).

Two output terminals (CMFBP,CMFBN) of the OTA 106 in the common mode feedback loop, which are paralleled to each other and of a same phase, are connected to the differential output terminals of the differential output circuit 101. Here, the respective parallel output terminals are connected to the respective differential output terminals of the second OTA 103. Alternatively, the respective parallel output terminals are connected to the respective differential output terminals of the first OTA 102.

The differential output voltage from the differential output terminals of the differential output circuit 101 are inputted to the common mode voltage detection circuit 105. The common mode voltage detection circuit 105 detects the common mode voltage VCM on the output side from the inputted differential output. The common mode voltage is in principle a mean value of the voltages of the differential output terminals, and is a direct voltage value when the input signal is a differential voltage. The common mode voltage detection circuit 105 outputs the detected voltage VCM2 in accordance with the common mode voltage VCM.

The detected voltage VCM2 is inputted to one of the input terminals of the OTA 106 in the common mode feedback loop. The reference voltage VCM1 is inputted to the other input terminal of the OTA 106 in the common mode feedback loop. The OTA 106 in the common mode feedback loop inputs or outputs in parallel the currents of the same phase in accordance with a difference between the voltages VCM1 and VCM2. The respective multiple currents of the same phase are inputted/outputted to/from the two respective terminals of the differential output terminals of the differential output circuit 101.

The currents to be inputted/outputted to/from the differential output terminals are-controlled such that the currents are flowed into the differential output terminals when the common mode voltage VCM is larger than the predetermined voltage. The currents are led in from the differential output terminals when the common mode voltage VCM is smaller than the predetermined voltage. Thus, a negative feedback loop is configured. Note that various modes of input/output of currents to/from the differential output terminals can be used.

In the operational amplifier or the OTA having a differential output, the common mode voltage thereof decreases when currents are flowed into the differential output terminals. On the other hand, the common mode voltage increases when currents are led in from the differential output terminals. Accordingly, as described above, the voltages of the both two terminals can be equally reduced in accordance with the same current flowed into the respective terminals of the two differential output terminals. Meanwhile, the voltages of both terminals can be equally increased in accordance with same current led from both terminals. The common mode voltage can be thus adjusted within a predetermined range.

For instance, by equalizing the detected voltage VCM2 to the reference voltage VCM1, the common mode voltage VCM on the output side can be set in equal to the reference voltage VCM1. When the common mode voltage VCM is larger than the reference voltage VCM1, the same two currents are flowed into the differential output terminals, thereby making the value of the common mode voltage very closer to that of the reference voltage VCM1. On the other hand, when the common mode voltage VCM is reduced, the same two currents are led from the differential output terminals, thereby making the value of the common mode voltage very closer to that of the reference voltage VCM1.

Note that, inmost cases, it is due to variations in current values between current mirror circuits that the common mode voltage on the output side deviates from the predetermined voltage. For example, in the case of the operational amplifier or the OTA, the mirror current values of the current mirror circuit on a power supply side and the current mirror circuit on a ground side are somewhat different due to influence of a channel length modulation of a MOS transistor or a base width modulation of a bipolar transistor. Therefore, the deviations of the current values are only small values of about several percent of the mirror current value of the current mirror circuit.

As described above, the common mode voltage is a direct voltage value. It is acceptable if the input/output currents of the OTA in the control loop can cover several percent of a sum of direct bias currents of the output circuits of all the operational amplifiers and OTAs that are connected to the differential output terminals. Moreover, since the direct bias currents are corrected, a frequency characteristic is not particularly required. Furthermore, linearity of the OTA is not very important, and it is sufficient as long as monotonicity thereof is secured. Accordingly, a simple circuit such as a differential pair can be used, for example. Further, since linear operation of the OTA is not required, an active load of a differential pair can be used, whereby all driving currents of the differential pair can be utilized.

Thus, according to the present example, the common mode voltage of the circuit having a differential output can be set to be a desired voltage. Moreover, the voltage control circuit for the common mode voltage of the present embodiment realizes, by inputting/outputting currents controlled by a differential output signal to/from the differential output terminals, a configuration in which a signal system is not brought into the control loop for the common mode voltage. In this way, the phase margin or the gain margin of the control signal loop can be secured even with a low current consumption, thereby realizing a stable operation of the circuit.

Alternatively, since the phase margin exists in the control loop for the common mode voltage, a loop gain thereof can be increased. Thus, a set voltage error of the voltage control circuit for the common mode voltage can be reduced. In addition, since it is acceptable as long as a direct current operation is secured, the input/output currents can be reduced, and thus the voltage control circuit for the common mode voltage with lower currents can be achieved.

According to the present invention, a voltage control circuit for a common mode voltage capable of effectively controlling the common mode voltage of the differential outputs can be obtained.

It is apparent that the present invention is not limited to the above embodiment, but may be modified and changed without departing from the scope and spirit of the invention.

What is claimed is:

1. A voltage control circuit for a common mode voltage, comprising:

a detection circuit for detecting a common mode voltage from differential output terminals of a differential output circuit, and outputting a detected voltage based on the common mode output voltage; and an operational transconductance amplifier for inputting the detected voltage and a first reference voltage, and inputting/outputting currents in proportion with a voltage difference between the detected voltage and the first reference voltage, wherein the currents inputted/outputted to/from the operational transconductance amplifier are inputted/outputted to/from a differential output of the differential output circuit.

2. The voltage control circuit for the common mode voltage according to claim 1, wherein the first reference voltage is a constant voltage determined in advance.

3. The voltage control circuit for the common mode voltage according to claim 1, wherein the currents inputted/outputted to/from the operational transconductance amplifier are flowed into the differential output to decrease the common mode output voltage from the differential output terminals, and led from the differential output to increase the common mode output voltage from the differential output terminals.

4. The voltage control circuit for the common mode voltage according to claim 1, wherein the currents inputted/outputted to/from the operational transconductance amplifier are inputted/outputted to/from the respective differential output terminals.

5. The voltage control circuit for the common mode voltage according to claim 1, wherein the operational transconductance amplifier inputs/outputs multiple currents of the same phase, and the respective multiple currents of the same phase are inputted/outputted to/from the respective differential output terminals.

6. The voltage control circuit for the common mode voltage according to claim 1, wherein the currents inputted/outputted to/from the operational transconductance amplifier are flowed into the differential output terminals when the common mode output voltage from the differential output terminals is larger than a predetermined voltage, and led from the differential output terminals when the common mode output voltage from the differential output terminals is smaller than the predetermined voltage.

* * * * *